United States Patent [19]
Herzl

[11] Patent Number: 4,788,646
[45] Date of Patent: Nov. 29, 1988

[54] FREQUENCY-TO-DIGITAL VALUE CONVERTER

[75] Inventor: Peter J. Herzl, Morrisville, Pa.

[73] Assignee: Fischer & Porter Company, Warminster, Pa.

[21] Appl. No.: 810,760

[22] Filed: Dec. 19, 1985

[51] Int. Cl.$^4$ ............................................. G01R 23/02
[52] U.S. Cl. ................................... 364/484; 324/78 D
[58] Field of Search .................... 364/484; 324/78 D; 84/454; 340/171 R

[56] References Cited

U.S. PATENT DOCUMENTS 4,257,003  3/1981  Yool .................................. 324/78 D
4,350,950  9/1982  Waldmann et al. .................. 364/484

Primary Examiner—Emanuel S. Kemeny
Attorney, Agent, or Firm—Michael Ebert

[57] ABSTRACT

A converter for converting a variable data frequency which lies in a low frequency range whose upper limit is about 200 Hz to a corresponding digital value. The converter includes an electronic counter having an enabling input and a count input. Derived from the data frequency is a data signal whose frequency is a given sub-multiple of the data frequency as selected by a digital computer. The data signal is applied to the enabling input to enable the counter for a period equal to the duration of a half cycle of the incoming data signal. Derived from an electronic clock operating at a constant frequency above 10,000 Hz is a clock signal whose pulse repetition rate is a given sub-multiple thereof as selected by the computer. These clock pulses are applied to the count input of the counter whereby the count accumulated therein is determined by the duration of the enabling period. This count is entered in the computer which, having selected the data signal and the clock signal, knows the scale factor, and can then, on the basis of the entered count, calculate the true period (P) of the data frequency (F) and provide a digital output corresponding to the frequency as determined by the equation $F = 1/P$.

7 Claims, 2 Drawing Sheets

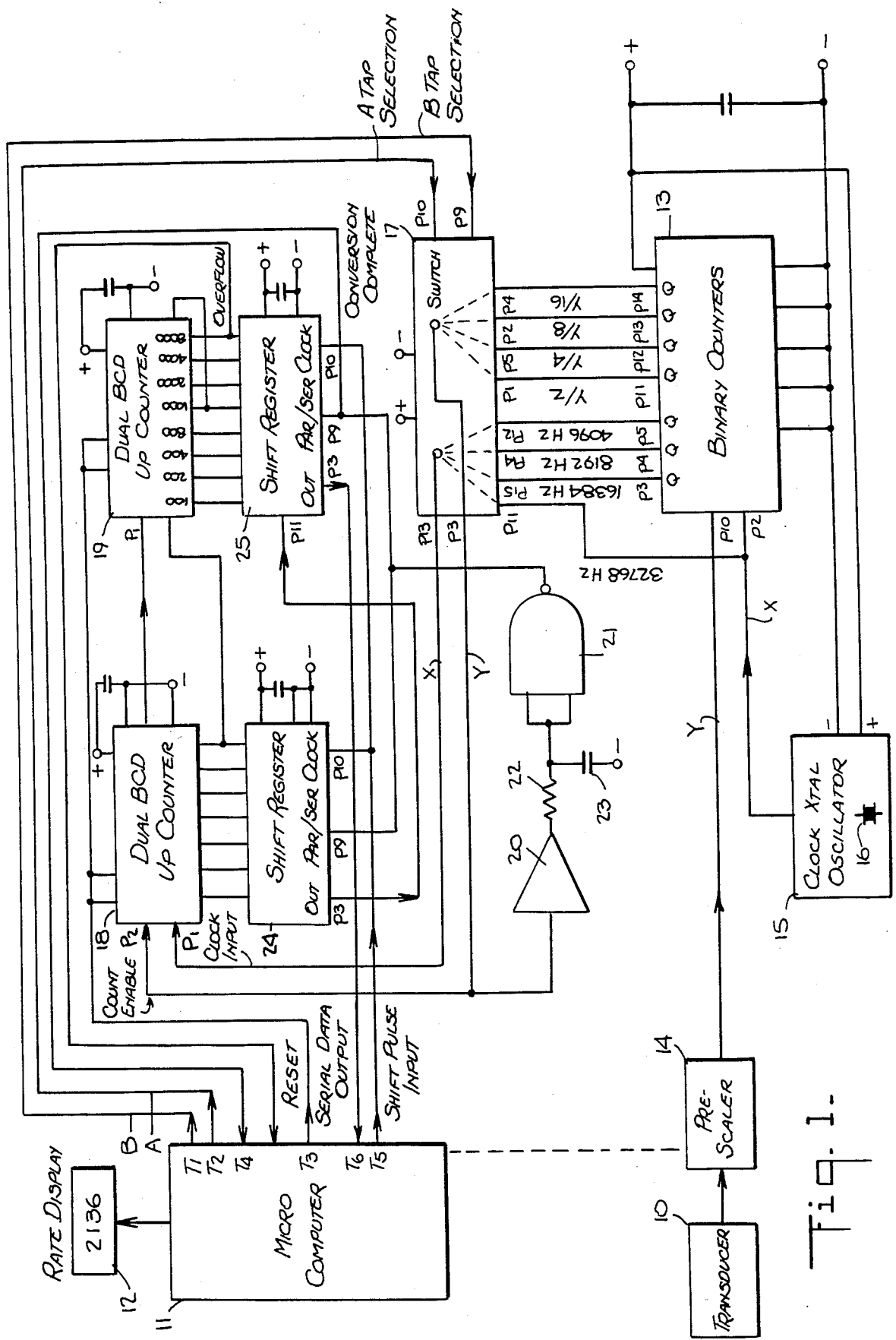

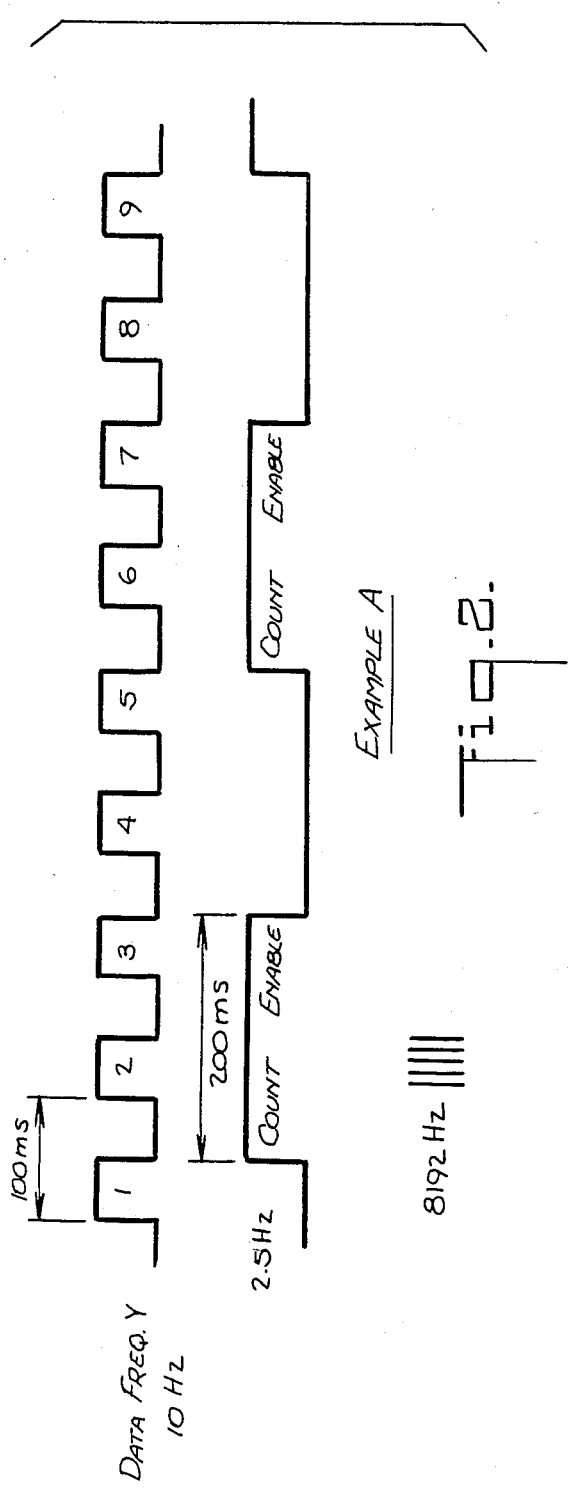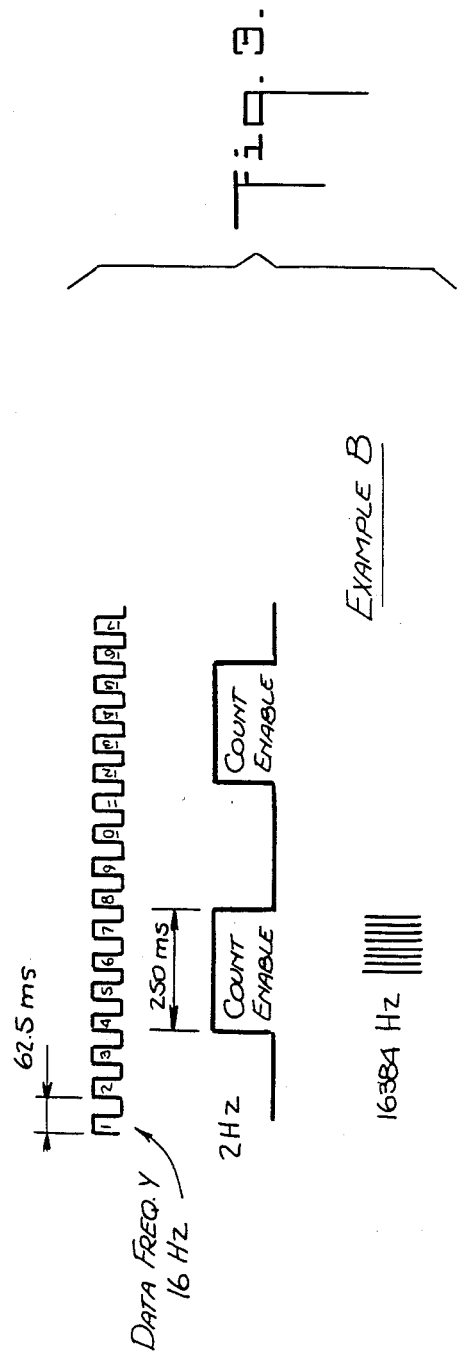

FREQUENCY-TO-DIGITAL VALUE CONVERTER

BACKGROUND OF INVENTION

1. Field of Invention

This invention relates generally to electronic converters adapted to change the frequency of an input signal into a corresponding digital value to provide a useful readout, and more particularly to an electronic converter of this type which consumes relatively little power and therefore may be battery operated.

2. Status of Prior Art

In certain types of flowmeters for metering the flow rate of a fluid, such as those of the positive displacement, the turbine or the vortex-shedding type, the output of the instrument is a signal whose frequency is proportional to the flow rate of the fluid being measured.

Thus, in a vortex flowmeter such as that described in the Herzl U.S. Pat. No. 4,162,238, the presence of an obstacle in the flow conduit gives rise to periodic vortices that are sensed to produce an output signal whose frequency is a function of flow rate.

The frequencies yielded by most known types of flowmeters usually lie in a 1 to 2000 Hz range, and in the case of a vortex type meter, the output signal lies within the low end of this range. Thus, as noted in Herzl U.S. Pat. No. 4,230,391, with a vortex type meter having a six-inch diameter, the output of this meter lies in the 2 to 30 Hz range, and in another embodiment the operating range is from 3.5 Hz to 52 Hz.

In order to provide a digital readout for a meter yielding a signal whose frequency is a function of flow rate, the signal must be converted into a corresponding digital value. To convert frequency to a corresponding digital value, it is known to pass the frequency through an electronic gate which is opened for a fixed period of time, the pulse count over the gated period being indicative of the frequency.

Conventional frequency-to-digital (f to d) converters consume a substantial amount of power, and they do not, therefore, lend themselves to battery operation. The power requirements of a conventional f to d converter creates a problem where the flowmeter that yields the signal to be converted is installed at a fixed location where power lines are not available, and it becomes necessary to use battery power. In this situation, the power demand of a conventional f to d converter cannot be satisfied by batteries, for these will be exhausted in a relatively short period.

SUMMARY OF INVENTION

In view of the foregoing, the main object of this invention is to provide a frequency-to-digital converter whose power requirements are in the microampere range, whereby the converter may be battery operated for a prolonged period without the need to replace the batteries.

A significant advantage of this invention is that the frequency-to-digital converter may be used in a remote flowmeter installation to provide a digital readout of flow rate.

More particularly, an object of the invention is to provide a converter of the above type which uses CMOS logic and a microcomputer, the CMOS circuits, exclusive of the microcomputer, operating on less than 50 microamps, and on less than 1 milliamperes including the microcomputer.

Also an object of the invention is to provide a high resolution converter using the lowest possible operating frequency, for the power dissipation of CMOS logic is proportional to the operating frequency; hence, the lower the operating frequency, the less is the power consumed.

Briefly stated, these objects are attained in a converter for converting a variable data frequency which lies in a low frequency range whose upper limit is about 200 Hz to a corresponding digital value. The converter includes an electronic counter having an enabling input and a count input. Derived from the data frequency is a data signal whose frequency is a given sub-multiple of the data frequency as selected by a digital computer. The data signal is applied to the enabling input to enable the counter for a period equal to the duration of a half cycle of the incoming data signal. Derived from an electronic clock operating at a constant frequency above 10,000 Hz is a clock signal whose pulse repetition rate is a given sub-multiple thereof as selected by the computer. These clock pulses are applied to the count input of the counter whereby the count accumulated therein is determined by the duration of the enabling period. This count is entered in the computer which, having selected the data signal and the clock signal, knows the scale factor, and can then, on the basis of the entered count, calculate the true period (P) of the data frequency (F) and provide a digital output corresponding to the frequency as determined by the equation $F = 1/P$.

OUTLINE OF DRAWINGS

For a better understanding of the invention as well as other objects and further features thereof, reference is made to the following detailed description to be read in conjunction with the accompanying drawings, wherein:

FIG. 1 is a block diagram of an f to d converter in accordance with the invention;

FIG. 2 shows one example of the wave form of the data frequency applied to the counter of the converter and the enabling period of the counter;

FIG. 3 shows another example of the data frequency wave form and the enabling period therefor.

DESCRIPTION OF INVENTION

Referring now to FIG. 1, an f to d converter in accordance with the invention is shown operating in conjunction with a transducer 10 whose output frequency is a function of the variable being sensed, such as a vortex-type meter. The output of this meter is a signal in a low frequency range, such as 2 to 40 Hz, that is proportional to flow rate. The converter provides a digital value corresponding to the frequency of the signal yielded by the transducer. This value is read out on a digital display 12 coupled to the output of a microcomputer 11.

Included in the converter is a pair of 4-bit binary counters 13 which in practice may be an RCA integrated circuit CMOS chip CD 4520BE having input pins p10, and p2. The data input Y which is applied to input pin p10 is derived from a pre-scaler or frequency divider 14 coupled to transducer 10.

Applied to the other input pin p2 of binary counters 13 are clock pulses Y. These are generated by a low-power, crystal-controlled oscillator 15 having a crystal 16. In practice, this may be an RCA-CD 4007UBE CMOS chip providing a timekeeping frequency of 32768 Hz.

When using CMOS logic, the power dissipation is approximately proportional to the operating frequency, and it is therefore desirable to provide a high resolution converter using the lowest possible operating frequency. By use of a standard 32768 Hz watch quartz crystal oscillator as a clock frequency, one achieves with the present converter a 16 bit binary of 4 decimal digit conversion accuracy. A further advantage of using a standard watch quartz crystal oscillator for the clock is that these are mass-produced and are relatively inexpensive, thereby combining high accuracy with low cost.

The design objective of the converter is to produce a high accuracy period (time) measurement with a 16 binary bit or 4 decimal digit resolution representing the time required by one or more cycles of the data frequency. This is accomplished over a large frequency range using the low speed 32768 Hz clock. Microcomputer 12 then performs a 1 period times a constant manipulation to turn the result into a frequency or a flow rate reading in which flow rate equals frequency times a constant.

The conversion is based on period; for with a low frequency, say, 1 Hz, it would take 1000 seconds to have a resolution of 0.1% by conventional counting techniques.

In binary counter 13 to which the data input Y is applied at input pin p10 and the clock pulses X are applied at input pin 2, the following frequencies are available at pins p2 to p5 and pins p11 to p14.

TABLE 1

| Clock X Frequencies | Data Y Frequencies |
|---|---|
| Pin 2 — 32768 Hz | Pin 11 — Data ÷ 2 |
| Pin 3 — 16384 Hz | Pin 12 — Data ÷ 4 |
| Pin 4 — 8192 Hz | Pin 13 — Data ÷ 8 |
| Pin 5 — 4096 Hz | Pin 14 — Data ÷ 16 |

Associated with binary counter 13 is a differential four-channel electronic switch 17 with decoded binary control line pins p9 and p10. In practice, this switch may be an RCA IC chip CD 4052B. Pins p9 and p10 of switch 17 are connected to terminals $T_1$ and $T_2$ of microcomputer 11 which acts to control switch 12. The microcomputer applies binary values to pin 9, which will be referred to as B values (0 or 1) and to pin 10, which will be called A values (0 or 1). Output pin p13 of switch 17 yields data pulses X, and output pin p3 yields clock pulses Y.

Electronic switch 17, in response to the A and B values applied thereto by microcomputer 11, carries out the various switching functions expressed in Table II below.

TABLE II

| Selection Logic | | Corrections made by Switch 17 | |
|---|---|---|---|
| Value A at p10 | Value B at p9 | pin 13(X) to pin | Pin 3 (Y) to pin |
| 0 | 0 | p12 | p1 |
| 1 | 0 | p14 | p5 |
| 0 | 1 | p15 | p2 |
| 1 | 1 | p11 | p4 |

Thus, if output pin 13 of switch 17 is internally connected to pin p12 of this switch, then since pin p12 is in turn connected to pin p5 of counter 13, the clock frequency X yielded at pin 13 of switch 17 is then 4096 Hz, which is one-sixteenth of the clock rate. And when output pin p13 of switch 17 is connected to pin p12 of this switch, the other output pin p3 is then connected to pin p1, which in turn is connected to pin p11 of binary counter 13; hence the data Y yielded at output pin 13 of switch 17 is then the input data frequency divided by 2.

Microcomputer 11, by selecting different A and B taps in switch 17, selectively provides clock X pulse rates and data Y pulse rates in accordance with table I.

The clock X output pulses of electronic switch 17 which appears at pin 13 is fed to the clock input p1 of a Dual Binary Coded Decimal BCD up counter 18 whose output goes to the input pin p1 of another DCA up counter 19. These BCD counters may be constituted in practice by RCA integrated circuit CMOS chips CD4518B. The data Y output pin 3 of switch 17 goes to input pin p2 of up counter 18 which is the count enable pin. This counter can count when the logic level is "1."

The data Y output of switch 17 at pin 3 is also fed to an inverter 20, the output of which is applied to another inverter 21 through a time delay circuit constituted by resistor 21 and capacitor 23. The output of inverter 21 goes to the parallel-serial (PARA/SER) input of shift registers 24 and 25, register 24 being operatively coupled to counter 18 and register 25 to counter 19 in an arrangement in which the parallel inputs of shift registers 24 and 25 are connected to the outputs of counters 18 and 19. The output of shift register 24 at pin p3 is connected to the series input pin p11 of shift register 25, while the output pin p3 of shift register 25 is connected to the serial data terminal $T_6$ of microcomputer 11.

Theory of Operation

Example A

We shall assume that the starting condition is that shown in Example A in FIG. 2 in which the data frequency Y yielded by pre-scaler 24 coupled to transducer 10 is 10 Hz. Hence, the period of a single cycle of this frequency is 100 ms.

Also, we shall assume that microcomputer 11 has set the value A at pin p10 of electronic switch 17 to logic "1," and value B at pin p9 of this switch to logic "0." By following the resultant connections as set forth in tables I and II, it will be evident that the data frequency Y at pin p3 in the output of switch 17 is now 2.5 Hz, these pulses being applied to the line leading to enable pin p2 of counter 18. It is also to be noted that this line is in a logic "1" state for half of the time or 200 milliseconds.

This means that counter 18 is now able to accept count pulses on input pin p1 from output pin p13 which yields clock X pulses, for 200 milliseconds. Again, referring to tables I and II, we find that the clock frequency at pin p13 in this example is 8192 Hz, and this is the input fed to input pin p1 of counter 18.

If counter 18 is reset by computer 11 by a reset signal sent out at terminal $T_3$ before the initiation of the 200 ms. count enable period, the count in counters 18 and 19 which is accumulated during the enable period is 8192 times 0.2 which equals 1638. This count is transferred in parallel into microcomputer 11 if sufficient input lines thereto are available. If these lines are in short supply, the count is then transferred into shift registers 24 and 25.

It is to be noted that the same line to pin p1 of counter 18 that enables this counter in the logic "1" state also puts the shift registers 24 and 25 in a parallel input mode. When, however, the enable line goes to logic "0" after a time delay determined by the network formed by resistor 22 and capacitor 23 connected to pin p9 of shift registers 24 and 25, the shift registers then go into a serial mode.

This time delay is required to permit the last count pulse to ripple through counters 18 and 19 before shift registers 24 and 25 switch over to the serial mode. When the control input on pin p9 of shift registers 24 and 25 goes to logic "0," it is also a signal to microcomputer 11 by way of terminal T4 that data conversion is complete. The microcomputer now generates 16 shift pulses which go from terminal T5 into pin p10 on shift registers 24 and 25. The data then moves in series into terminal T6 of the computer from pin p3 of shift register 25.

Having set the A and B lines into electronic switch 17 at tap selection pins p10 and p9, computer 11 knows the scale factor, for this is determined by which taps switch 17 is set on. The computer can then convert the 1638 count in example A to a true time period. The frequency which is read out digitally in display 12 is equal to one divided by this time period.

For all periodic waves, the period is the time required for completing a single cycle of oscillation. Hence, the reciprocal of the period (P) is the frequency ($f = 1/P$). Since the computer now knows the true time period of the data frequency, it becomes a simple matter for the computer to provide a digital value representing this frequency.

Example B

We shall now assume an increase in the input data frequency Y. As this data frequency increases, the count enable period becomes shorter and the count accumulated during this period in counters 18 and 19 will therefore decrease. When this accumulating count drops to 1000, computer 11 then decides that the resolution is inadequate, and it changes the value A line to the logic "0" state and the value "B" line to the logic "1" state. This occurs at about 16 Hz, as shown in Example B illustrated in FIG. 3. The 16 Hz frequency is now divided by 8 and becomes 2 Hz, and the count enable period becomes 0.250 seconds. Hence, the frequency at the count input pin p1 of counter 18 will be 16384 Hz. And the total count accumulated will then be 16384 Hz times $0.25 = 4096$.

When data frequency Y climbs further to about 64 Hz, the resolution will again drop to nearly 1,000 and computer 11 will then switch the value A line to logic state "1" and the B value line to logic state "1." This will maintain a maximum 1,000 count resolution for 262 Hz. The numbers would still be correct above this frequency, but the resolution would drop. For still higher data frequencies, a manual or computer-controlled pre-scaler can be used.

If the data frequency falls, the opposite phenomenon takes place and the count accumulated in counters 18 and 19 increases. When the count rises above 6,000, computer 11 switches the A and B lines to obtain a lower count. The lowest count obtainable is when value A is set to logic "0" and value B is also set to logic "0." In this state, the frequency at output pin p3 of switch 17 is 4096 Hz, and a 6,000 count in counters 18 and 19 will be reached at 0.68 Hz. Computer 11 will try to switch down but will find that it is already at its bottom A-B tap position. If the frequency continues down, then when the count in counters 18 and 19 reaches or exceeds 8,000 (the equivalent of 0.512 Hz), the computer will treat the frequency as 0 Hz.

A converter in accordance with the invention shows good conversion efficiency with a minimum resolution of 0.1% for frequencies between 0.512 and 262 Hz, a 511 to 1 range. This range can be extended by pre-scaling or by adding further stages to counters 18 and 19.

While there has been shown and described a preferred embodiment of a frequency-to-digital value converter in accordance with the invention, it will be appreciated that many changes and modifications may be made therein without, however, departing from the essential spirit thereof.

I claim:

1. A converter to convert an incoming variable data frequency which lies in a low frequency range whose upper limit is about 2,000 Hz to a corresponding digital value, the converter comprising:
   (A) a digital computer;
   (B) an electronic UP counter having an enabling input and a count input;
   (C) means controlled by the computer to derive from the incoming data frequency a data signal whose frequency is a selected sub-multiple of the data frequency;
   (D) an electronic clock operating at a constant frequency which exceeds 10,000 Hz;
   (E) means controlled by the computer to derive from the clock frequency a clock signal having periodic pulses whose repetition rate is a selected sub-multiple of the clock frequency;
   (F) means to apply the data signal to the enabling input of the UP counter to enable the counter for an enabling period equal to a half cycle of the applied data signal;
   (G) means to apply the clock signal to the count input of the UP counter whereby the count accumulated therein is determined by the number of pulses in the clock signal which appear during the enabling period; and
   (H) means to enter the accumulated count in the computer which, on the basis of the data signal and the clock signal selected by the computer, then functions to calculate the time period (P) of the data frequency (F), from which it then calculates and provides a digital output corresponding to the incoming data frequency based on the equation $F = 1/P$.

2. A converter as set forth in claim 1, wherein said variable data frequency is derived from a vortex-type flowmeter.

3. A converter as set forth in claim 1, wherein said means controlled by the computer to produce the data signal is constituted by a binary counter having multiple outputs each yielding a frequency which is a different sub-multiple of the incoming data frequency, and an electronic multi-tap switch coupled to said outputs and controlled by the computer to select any one of said outputs to provide a desired sub-multiple of the data frequency.

4. A counter as set forth in claim 3, wherein said different sub-multiples are respectively one-half, one-fourth, one-eighth and one-sixteenth of the data frequency.

5. A converter as set forth in claim 1, wherein said means controlled by the computer to produce the clock signal is constituted by a binary counter having multiple outputs each yielding clock pulses at a rate which is a different sub-multiple of the clock frequency, and an electronic multi-tap switch coupled to said outputs and controlled by the computer to select any one of said outputs to provide a desired sub-multiple of the clock frequency.

6. A converter as set forth in claim 1, wherein the elements of the combination are constituted by CMOS integrated circuits which are battery powered.

7. A converter as set forth in claim 6, wherein said clock is a crystal-controlled oscillator operating at 32,768 Hz.

* * * * *